US007776505B2

(12) United States Patent
Gonsalves

(10) Patent No.: US 7,776,505 B2
(45) Date of Patent: *Aug. 17, 2010

(54) HIGH RESOLUTION RESISTS FOR NEXT GENERATION LITHOGRAPHIES

(75) Inventor: Kenneth E. Gonsalves, Concord, NC (US)

(73) Assignee: The University of North Carolina at Charlotte, Charlotte, NC (US)

( * ) Notice: Subject to any disclaimer, the term of this patent is extended or adjusted under 35 U.S.C. 154(b) by 67 days.

This patent is subject to a terminal disclaimer.

(21) Appl. No.: 11/226,912

(22) Filed: Sep. 14, 2005

(65) Prior Publication Data

US 2006/0121390 A1 Jun. 8, 2006

Related U.S. Application Data

(63) Continuation-in-part of application No. 09/992,560, filed on Nov. 5, 2001, now Pat. No. 7,008,749, and a continuation-in-part of application No. 10/324,642, filed on Dec. 19, 2002, now Pat. No. 7,049,044.

(51) Int. Cl.
*G03F 7/028* (2006.01)
*G03F 7/039* (2006.01)

(52) U.S. Cl. .................... 430/270.1; 430/914; 430/921; 430/925; 526/287

(58) Field of Classification Search .............. 430/270.1, 430/281.1, 285.1, 286.1, 914, 921, 925, 910; 526/286, 287
See application file for complete search history.

(56) References Cited

U.S. PATENT DOCUMENTS

| | | | |
|---|---|---|---|
| 3,849,137 A | | 11/1974 | Barzynski et al. |
| 4,225,664 A | | 9/1980 | Moran et al. |
| 4,717,513 A | | 1/1988 | Lewis et al. |
| 5,130,392 A | * | 7/1992 | Schwalm et al. ............. 526/288 |
| 5,459,021 A | | 10/1995 | Ito et al. |
| 5,780,201 A | | 7/1998 | Sabnis et al. |
| 5,945,250 A | | 8/1999 | Aoai et al. |
| 5,965,325 A | | 10/1999 | Matsuo et al. |
| 6,017,677 A | * | 1/2000 | Maemoto et al. ......... 430/270.1 |
| 6,232,034 B1 | | 5/2001 | Kasai et al. |
| 6,238,541 B1 | | 5/2001 | Sasaki et al. |
| 6,280,911 B1 | * | 8/2001 | Trefonas, III ................ 430/326 |
| 6,306,556 B1 | | 10/2001 | Matsuo et al. |
| 6,391,471 B1 | | 5/2002 | Hiraoka et al. |
| 6,420,084 B1 | | 7/2002 | Angelopoulos et al. |
| 6,468,717 B2 | | 10/2002 | Kita et al. |
| 6,468,725 B2 | | 10/2002 | Takamuki |
| 6,479,210 B2 | | 11/2002 | Kinoshita et al. |
| 6,492,086 B1 | | 12/2002 | Barclay et al. |
| 6,512,081 B1 | | 1/2003 | Rizzardo et al. |
| 6,517,958 B1 | | 2/2003 | Sellinger et al. |
| 6,696,148 B1 | | 2/2004 | Seino et al. |
| 6,716,919 B2 | | 4/2004 | Lichtenhan et al. |
| 6,884,562 B1 | | 4/2005 | Schadt, III et al. |
| 7,008,749 B2 | * | 3/2006 | Gonsalves ................ 430/270.1 |
| 7,049,044 B2 | * | 5/2006 | Gonsalves et al. ......... 430/270.1 |
| 2002/0015913 A1 | * | 2/2002 | Uetani et al. .............. 430/270.1 |
| 2002/0081523 A1 | * | 6/2002 | Uetani et al. .............. 430/270.1 |
| 2002/0147259 A1 | * | 10/2002 | Namba et al. ................ 524/377 |
| 2002/0182541 A1 | | 12/2002 | Gonsalves |
| 2003/0146418 A1 | | 8/2003 | Chacko |
| 2004/0166432 A1 | * | 8/2004 | Ohsawa et al. ............... 430/170 |
| 2004/0224259 A1 | * | 11/2004 | Anzures et al. ........... 430/281.1 |
| 2004/0248039 A1 | * | 12/2004 | Sounik et al. ............. 430/281.1 |
| 2006/0024610 A1 | * | 2/2006 | Padmanaban et al. ..... 430/270.1 |

FOREIGN PATENT DOCUMENTS

| | | |
|---|---|---|
| EP | 0 473 547 A1 | 3/1992 |
| JP | 05-086133 | 4/1993 |
| JP | 06-228086 | 8/1994 |
| JP | 10-221852 | 8/1998 |
| JP | 2000-334881 | 12/2000 |
| WO | WO 2005/109102 | * 11/2005 |

OTHER PUBLICATIONS

Wu, H. et al. "Novel CA Resists with Photoacid Generator in Polymer Chain", Advances in Resist Technology and Processing XVIII, Proceedings of SPIE, vol. 4345(2001), pp. 521-527.*
Brainard, R. et al., "Resists for Next Generation Lithography," Microelectronic Engineering, vols. 61-62, pp. 707-715, 2002.
Canning, J., "Next Generation Lithography When, Why, and at What Cost? (Abstract)" Microelectronic Engineering, vols. 61-62, p. 7, 2002.
Gonsalves, K. et al., "Combinatorial Approach for the Synthesis of Terpolymers and their Novel Application as Very-High-Contrast Resists for X-Ray Nanolithography," J. Vac. Sci. Technol. B., vol. 18, No. 1, pp. 325-327, 2000.
Gonsalves. K. et al., "High Resolution Resists for Next Generation Lithography: The Nanocomposite Approach," Mat. Res. Soc. Symp. Proc., vol. 636, pp. D6.5.1-D6.5.11, 2001.
Haddad, T. et al., "Hybrid Organic-Inorganic Thermoplastics: Styryl-Based Polyhedral Oligomeric Silsesquioxane Polymers," Macromolecules, vol. 29, pp. 7302-7304, 1996.
Hu, Y. et al., "Nanocomposite Resists for Electron Beam Nanolithography," Microelectronic Engineering, vol. 56, pp. 289-294, 2001.
Merhari, L. et al., "Nanocomposite Resist for Next Generation Lithography," Microelectronic Engineering, vol. 63, pp. 391-403, 2002.
Pyun, J. et al., "Synthesis of Organic/Inorganic Hybrid Materials from Polysiloxane Precursors using Atom Transfer Radical Polymerization," Polymer Preprints, vol. 40, No. 2, pp. 454-455, 1999.

(Continued)

Primary Examiner—Cynthia H Kelly
Assistant Examiner—Anca Eoff
(74) Attorney, Agent, or Firm—J. Clinton Wimbish; Kilpatrick Stockton LLP

(57) ABSTRACT

The present invention addresses many of the current limitations in sub-100 nm lithographic techniques by providing novel resists that achieve high sensitivity, high contrast, high resolution, and high dry-etch resistance for pattern transfer to a substrate. In one embodiment, the present invention provides a polymeric resist comprising an adamantyl component and a photoacid generating component.

12 Claims, 13 Drawing Sheets

OTHER PUBLICATIONS

Saito, S. et al., "A New Positive Electron-Beam Resist Material Composed of Catechol Derivatives" Microelectronic Engineering, vols. 61-62, pp. 777-781, 2002.

Wu, H. et al., "Incorporation of Polyhedral Oligosilsesquioxane in Chemically Amplified Resists to Improve their Reactive Ion Etching Resistance," J. Vac. Sci. Technol. B., vol. 19, No. 3, pp. 851-855, 2001.

Wu, H. et al., "Synthesis and Characterization of Radiation-Sensitive Polymers and their Application in Lithography (Abstract)," Ph.D. Dissertation, University of Connecticut, Apr. 2001.

Wu, H. et al., "Preparation of a Photoacid Generating Monomer and Its Application in Lithography," Adv. Funct. Mater., vol. 11, No. 4, pp. 271-276, 2001.

Wu, H. et al., "A Novel Single-Component Negative Resist for DUV and Electron Beam Lithography," Adv. Mater., vol. 13, No. 3, pp. 195-197, 2001.

Wu, H. et al., "Polymer-Inorganic High Contrast and High Sensitivity Resists for Nanolithography," Mat. Res. Soc. Symp. Proc., vol. 584, pp. 121-128, 2000.

* cited by examiner (a)

(b)

HIGH RESOLUTION RESISTS FOR NEXT GENERATION LITHOGRAPHIES

PRIOR RELATED U.S. APPLICATION DATA

This application is a continuation in part of U.S. patent application Ser. No. 09/992,560 filed Nov. 5, 2001, now U.S. Pat. No. 7,008,749 which is hereby incorporated by reference in its entirety. This application is also a continuation in part of U.S. patent application Ser. No. 10/324,642 filed Dec. 19, 2002, now U.S. Pat. No. 7,049,044 which is hereby incorporated by reference in its entirety.

FIELD OF THE INVENTION

The present invention relates to resists applicable to various lithographic processes, techniques, and applications.

BACKGROUND OF THE INVENTION

Lithographic techniques for photoresist patterning with resolutions down to the 32 nm node are essential for future device miniaturization. (See: The 2003 Edition of the ITRS: Lithography, 2003 International Technology Roadmap for Semiconductors: http://public.itrs.net/2003). Patterning at the nanometer scale can be achieved in various ways including optical, atomic force microscope, scanning probe, electron beam, nanoimprint, and extreme ultraviolet lithography (EUV lithography). In order to keep pace with the demand for rapid printing of smaller features, it is necessary to gradually reduce the wavelength of light used for imaging and to design imaging systems with larger numerical apertures.

EUV lithography, for example, uses short wavelength (13.4 nm) radiation to administer projection imaging or lithographic patterning. As a result of its short wavelength radiation, EUV lithography has evolved into a possible candidate for the production of future integrated circuits at the 45 or 32 nm mode. Much of the work to date, however, has focused on aspects of lithography tool development as opposed to resist performance.

Two primary types of resist polymers that have been investigated are chain-scission resists and chemically amplified (CA) resists. Upon irradiation of a chain-scission resist film, the molecular weights of the polymers in the exposed regions are decreased via chain scission reactions arising from the irradiation. As a result, solubility differentiation is achieved between the exposed and the unexposed regions. Chemically amplified resists achieve solubility differentiation based on an acid-catalyzed deprotection reaction which changes the polarity of the polymer in the exposed region. A typical CA resist formula consists of a matrix polymer and a photoacid generator (PAG). Upon irradiation with an electron beam or extreme UV radiation, the PAG generates a strong acid that catalyzes the deprotection reaction.

Several classes of PAGs have been used in CA resists. These PAGs, however, are almost exclusively used in their small molecule forms, and small molecule PAGs typically exhibit limited compatibility with the resist polymer matrix. As a result, problems such as phase separation, non-uniform acid distribution, and non-uniform acid migration occurring during temperature fluctuations (e.g. variation in baking processing) may arise. Such limitations frequently lead to an undesirable, premature and non-uniform deprotection reaction in the CA resist film. It would be desirable to develop a fundamentally new way of adding PAGs into a resist polymer to alleviate these problems.

Moreover, resists for EUV lithography and other lithographic techniques must possess reasonable photospeed while maintaining a low level of outgassing components. Lithographic resists must additionally demonstrate high sensitivity, high contrast and resolution, low absorption, high dry-etch resistance, good adhesion to substrates, and low line-edge roughness. Current resists for sub-100 nm patterning applications, including EUV lithography, display poor etch resistance, poor outgassing properties, and undesirable absorption coefficients. As a result, it would be desirable to provide resists that exhibit improved properties for lithographic processes such as EUV, X-ray (XRL), electron beam (EBL), and ion beam (IBL) lightographies.

SUMMARY

The present invention addresses many of the current limitations in sub-100 nm lithographic techniques by providing new resists that achieve high sensitivity, high contrast, high resolution, and high dry-etch resistance for pattern transfer to a substrate. Moreover, the present invention provides resists that overcome compatibility problems associated with PAGs, which can lead to phase separation, non-uniform acid distribution, and non-uniform acid migration occurring during temperature fluctuations. These solutions are achieved through a variety of new resist architectures that incorporate new functional components into resist polymer matrices in novel ways.

In one embodiment, the present invention provides a polymeric resist comprising a hydroxystyrene component and an adamantyl component. In some embodiments, a polymeric resist comprising a hydroxystyrene component and adamantyl component may further comprise a blended photoacid generating component.

In some embodiments, the present invention provides a polymeric lithographic resist comprising a hydroxystyrene component, an adamantyl component, and a photoacid generating component. In some embodiments, the photoacid generating component comprises a cationic photoacid generator, an anionic photoacid generator, a covalent photoacid generator, or combinations thereof.

In some embodiments, the present invention provides a polymeric resist comprising an adamantyl component and a photoacid generating component.

The present invention also provides methods for producing lithographic resists. In one embodiment, a method of the present invention comprises copolymerizing a hydroxystyrene component and an adamantyl component. A method comprising copolymerization of a hydroxystyrene component and an adamantyl component, in some embodiments, may further comprise blending into the resulting copolymer a photoacid generating component. In some embodiments, the photoacid generating component comprises a cationic photoacid generator, an anionic photoacid generator, a covalent photoacid generator, or combinations thereof.

In another embodiment, a method for producing a lithographic resist comprises incorporating a photoacid generating component in the polymeric backbone of a polymeric resist. In one embodiment, a photoacid generating component can be copolymerized with an adamantyl component. In some embodiments, a photoacid generating component can be copolymerized with an adamantyl component and a hydroxystyrene component. The photoacid generating component, in some embodiments can comprise cationic photoacid generator, an anionic photoacid generator, a covalent photoacid generator, or combinations thereof.

The present invention additionally provides lithographic processes. In one embodiment, a lithographic process of the present invention comprises exposing a lithographic recording medium to radiation to form a pattern and developing the pattern, wherein the lithographic recording medium comprises a polymeric resist comprising a hydroxystyrene component and an adamantyl component. In some embodiments, the lithographic recording medium comprising a hydroxystyrene component and an adamantyl component further comprises a blended photoacid generating component.

In some embodiments, a lithographic process of the present invention comprises exposing a lithographic recording medium to radiation to form a pattern and developing the pattern, wherein the lithographic recording medium comprises a polymeric resist comprising a hydroxystyrene component, an adamantyl component, and a photoacid generating component. In some embodiments, the photoacid generating component can comprise a cationic photoacid generator, an anionic photoacid generator, a covalent photoacid generator, or combinations thereof.

A lithographic process of the present invention, in some embodiments, comprises exposing a lithographic recording medium to radiation to form a pattern and developing the pattern, wherein the lithographic recording medium comprises a polymeric resist comprising an adamantyl component and a photoacid generating component. In some embodiments, the photoacid generator of the lithographic recording medium comprises a cationic photoacid generator, an anionic photoacid generator, a covalent photoacid generator, or combinations thereof.

In some embodiments of lithographic processes of the present invention, radiation used in the pattering of resists comprises extreme ultraviolet radiation (EUV), x-ray radiation, electron beam radiation, ion beam radiation, or combinations thereof.

In another embodiment, the present invention provides integrated circuits prepared by lithographic processes utilizing the presently described resists.

A feature and advantage of the present invention is the provision of polymeric resists with increased resolution and improved pattern definition over currently available resist materials.

Another feature and advantage of the present invention is the provision of polymeric resists with improved outgassing properties, absorption characteristics, and etch resistance over currently available resist materials.

Another feature and advantage of the present invention is the provision of polymeric resists which demonstrate reduced proximity effects and thereby provide enhanced resolution for lithographic applications such as EUV lithography.

A further feature and advantage of the present application is the provision of polymeric resists that incorporate photoacid generating groups (PAGs) at high loading/high concentration, but do not suffer from the phase separation, non-uniform acid distribution, and non-uniform acid migration problems common among standard chemically amplified resists.

These and other features, embodiments, objects, and advantages of the present invention will become apparent after a review of the following detailed description of the disclosed embodiments.

DETAILED DESCRIPTION OF THE INVENTION

Figure 1:
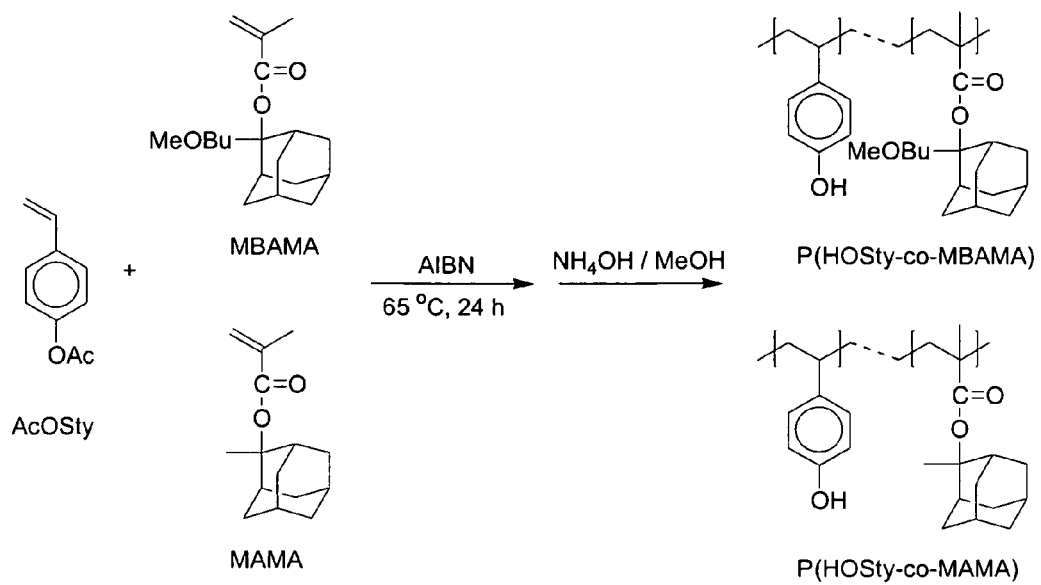
FIG. 1 illustrates a synthesis scheme for a polymeric resist according to one embodiment of the present invention.

The present invention provides new high resolution resists applicable to next generation lithographies, methods of making these novel resists, and methods of using these resists to effect state-of-the-art lithographies.

Definitions

In order to more clearly define the terms used herein, the following definitions are provided.

A resist, as used herein, refers to the imaging or recording medium, usually a polymeric material, that is used in a lithographic process, typically for the production of integrated circuits. In a general sense, a resist is a material that is used to prevent a particular chemical or physical reaction such as chemical attack, electrodeposition, vapor phase deposition, or other reactions. A resist of the present invention may comprise a positive resist or a negative resist.

Lithography, or a lithographic process, as used herein, refers to a process by which the pattern, typically a pattern of an integrated circuit, is imprinted onto a substrate or a resist. Lithography may be accomplished by exposing a recording medium with radiation of some form, followed by developing the pattern to be used, which results in the removal of either the exposed or the unexposed material. A variety of radiation sources may be used, including but not limited to, extreme ultraviolet (EUV) or deep ultraviolet (DUV) radiation, X-rays, electron beams, and ion beams.

Novel Polymeric Resists Comprising Hydroxystyrene and Adamantyl Components

The present invention provides polymeric resists comprising a hydroxystyrene component and an adamantyl component. In some embodiments, the hydroxystyrene component can comprise para-hydroxystyrene (PHS), poly-(para-hydroxystyrene) (poly-PHS), or combinations thereof. In some embodiments, the adamantyl component can comprise an adamantyl methacrylate. Adamantyl methacrylates, in some embodiments of the present invention, can comprise methyl-adamantyl methacrylates, ethyl-adamantyl methacrylates, such as 2-ethyl-2-adamantyl methacrylate, propyl-adamantyl methacrylates, butyl-adamantyl methacrylates, methoxybutyl-adamantyl methacrylates, such as 2-(4-methoxybutyl)-2-adamantly methacrylate, 3-hydroxy-adamantyl methacrylates, or combinations thereof.

Polymeric resists comprising a hydroxystyrene component and an adamantyl component can exhibit improved sensitivity, resolution, and etch resistance when exposed to radiation such as extreme ultraviolet radiation. In some embodiments, polymeric resists comprising an polyhydroxystyrene component and an adamantyl component can be generally synthesized according to the reaction scheme illustrated in FIG. 1. The hydroxystyrene component and adamantyl component may be copolymerized to produce the resist. FIG. 2 illustrates an FT-IR spectrum of polymeric resist of the present invention comprising a hydroxystyrene component copolymerized with an adamantyl methacrylate component.

In some embodiments a polymeric resist comprising a hydroxystyrene component and an adamantyl component can comprise about 70 mol % hydroxystyrene component and about 30 mol % adamantyl component. In some embodiments, a polymeric resist comprising a hydroxystyrene component and an adamantyl component can comprise about 57 mol % hydroxystyrene component and about 43 mol % adamantyl component. In some embodiments, a polymeric resist comprising a hydroxystyrene component and an adamantyl component can comprise about 78 mol % hydroxystyrene component and about 22 mol % adamantyl component.

In some embodiments, the hydroxystyrene component content of a polymeric resist comprising a hydroxystyrene component and an adamantyl component can range from about 50 mol % to about 90 mol %. In some embodiments, the hydroxystyrene component content of a polymeric resist comprising a hydroxystyrene component and an adamantyl component can range from about 60 mol % to about 80 mol %. In some embodiments, the hydroxystyrene component content of a polymeric resist comprising a hydroxystyrene component and an adamantyl component can be greater than about 80 mol %.

In some embodiments, the adamantyl component content of a polymeric resist comprising a hydroxystyrene component and an adamantyl component can range from about 10 mol % to about 50 mol %. In some embodiments, the adamantyl component content of a polymeric resist comprising a hydroxystyrene component and an adamantyl component can range from about 20 mol % to about 40 mol %. In some embodiments, the adamantyl component content of a polymeric resist comprising a hydroxystyrene component and an adamantyl component can be less than 20 mol %.

In some embodiments, the weight average molecular weight ($M_w$) of a polymeric resist comprising a hydroxystyrene component and an adamantyl component can range from about 2200 to about 8000. In some embodiments, the glass transition ($T_g$) temperature of a polymeric resist comprising a hydroxystyrene component and an adamantyl component can range from about 100° C. to about 170° C. In some embodiments, the glass transition temperature can range from about 100° C. to about 110° C.

In some embodiments, the polydispersity of a polymeric resist comprising a hydroxystyrene component and an adamantyl component can range from about 1.0 to 2.0.

In some embodiments, a polymeric resist of the present invention comprising a hydroxystyrene component and an adamantyl component may further comprise a photoacid generating component blended in the polymeric resist matrix. In some embodiments, the photoacid generator can comprise a sulfonium compound, an ionium compound, or a combination thereof. In some embodiments, the photoacid generating component can comprise triphenylsulfonium nonafluoro-1-butenesulfonate. In some embodiments, the photoacid generating component can comprise a cationic photoacid generator, an anionic photoacid generator, a covalent photoacid generator, or combinations thereof. Cationic photoacid generators, according to some embodiments of the present invention, can comprise [p-$CH_2$=$C(CH_3)C(O)OC_6H_4SMe_2$]$OSO_2CF_3$, [p-$CH_2$=C ($CH_3)C(O)OC_6H_4SMe_2$]$OSO_2C_4F_9$, or combinations thereof. Anionic photoacid generators, according to some embodiments of the present invention, can comprise [p-$CH_2$=CH—$C_6H_4SO_3$]$S(Me_2)(C_6H_5)$. Covalent photoacid generators, according to embodiments of the present invention, can comprise N-styrenesulfonyloxy-5-norborene-2,3 dicarboxyimide (SSNI), N-styrenesulfonyloxy phthalimide (SSPI), or combinations thereof. The photoacid generating component, in some embodiments, can be blended into the hydroxystyrene-adamantyl methacrylate copolymer.

Figure 3:
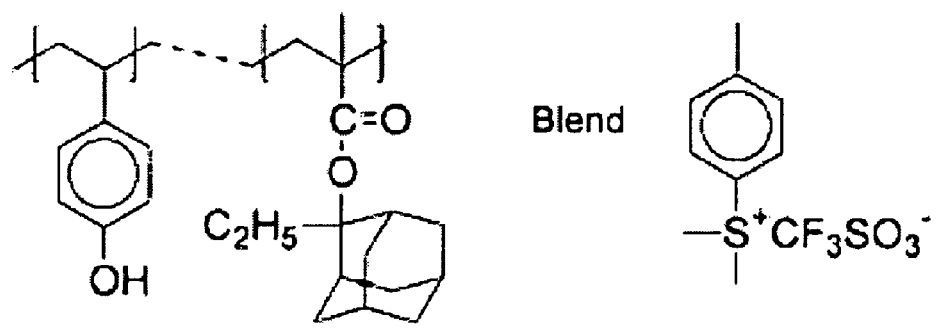
FIG. 3 illustrates a resist architecture according to an embodiment of the present invention.
Figure 4:
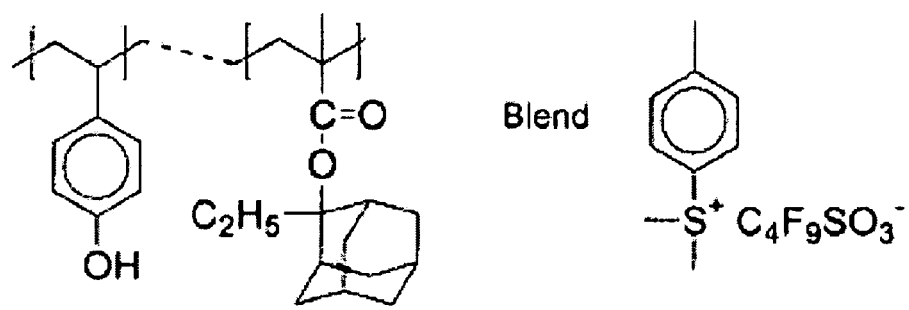
FIG. 4 illustrates a resist architecture according to an embodiment of the present invention.

In one embodiment, a polymeric resist comprising a hydroxystyrene component and an adamantyl component comprises poly[4-hydroxystyrene-co-2-(4-methoxybutyl)-2-adamantyl methacrylate]. In another embodiment, a polymeric resist comprising a hydroxystyrene component and an adamantyl component comprises poly[4-hydroxystyrene-co-2-ethyl-2-adamantyl methacrylate]. Photoacid generating groups such as [p-$CH_2$=$C(CH_3)C(O)OC_6H_4SMe_2$]$OSO_2CF_3$ and/or $CH_2$=$C(CH_3)C(O)OC_6H_4SMe_2$]$OSO_2C_4F_9$ can be blended into these resists according to the resist architectures illustrated in FIGS. 3 and 4.

In some embodiments, a polymeric resist comprising a hydroxystyrene component, an adamantyl component, and a blended photoacid generating component can further comprise a base component. The base component, in some embodiments, can be blended into the polymer matrix. Base components operable to blended into the polymer matrix, in some embodiments, can comprise triethyl amine, trioctyl amine, tetramethyl ammonium hydroxide, and tetrabutyl ammonium hydroxide.

In some embodiments, the base component can be incorporated in the backbone or main chain of the polymeric resist. Base components operable to be incorporated into the polymeric backbone of the polymeric resist, in some embodiments, can comprise N-vinylpyrrolidone and other bases with polymerizable functionalities. Base components, according to embodiments of the present invention, can be operable to control acid diffusion and concomitantly enhance resolution.

Chemically Amplified Resists with Photoacid Generating Groups (PAGs) Incorporated in the Resist Chains To alleviate problems associated with simply adding or blending monomeric photoacid generating groups (PAGs) in chemically amplified resist films, the present invention incorporates photoacid generating units directly into the polymeric resist chains as part of the polymeric unit.

In one embodiment of the present invention, a polymeric resist comprising at least one photoacid generating unit incorporated directly in the polymeric resist chain comprises an adamantyl component and a photoacid generating component. In some embodiments of a polymeric resist comprising an adamantyl component and a photoacid generating component, the adamantyl component may comprise an adamantyl methacrylate. Adamantyl methacrylates for use in polymeric resists of the present invention can comprise methyl-adamantyl methacrylates, ethyl-adamantyl methacrylates, such as 2-ethyl-2-adamantyl methacrylate, propyl-adamantyl methacrylates, butyl-adamantyl methacrylates, methoxybutyl-adamantyl methacrylates, such as 2-(4-methoxybutyl)-2-adamantly methacrylate, 3-hydroxy-adamantyl methacrylates or combinations thereof.

In some embodiments of a polymeric resist comprising an adamantyl component and a photoacid generating component, the photoacid generating component can comprise a sulfonium compound, ionium compound, or combinations thereof. In some embodiments, the photoacid generating group can comprise a cationic photoacid generator, an anionic photoacid generator, a covalent photoacid generator, or combinations thereof. Cationic photoacid generators, according to some embodiments of the present invention, can comprise $[p-CH_2=C(CH_3)C(O)OC_6H_4SMe_2]OSO_2CF_3$, $[p-CH_2=C(CH_3)C(O)OC_6H_4SMe_2]OSO_2C_4F_9$, or combinations thereof. Anionic photoacid generators, according to some embodiments of the present invention, can comprise $[p-CH_2=CH—C_6H_4SO_3]S(Me_2)(C_6H_5)$. Covalent photoacid generators, according to embodiments of the present invention, can comprise N-styrenesulfonyloxy-5-norborene-2,3 dicarboxyimide (SSNI), N-styrenesulfonyloxy phthalimide (SSPI), or combinations thereof.

Polymeric resists comprising an adamantyl component and a photoacid generating component can further comprise, in some embodiments, a hydroxystyrene component. The hydroxystyrene component can comprise para-hydroxystyrene (PHS), poly-(para-hydroxystyrene) (poly-PHS), or combinations thereof.

Figure 5:
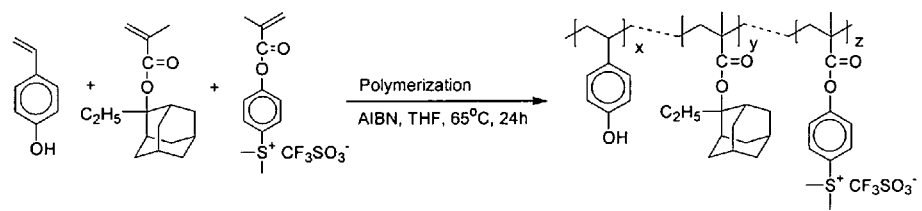
FIG. 5 illustrates a synthesis scheme for a polymeric resist according to one embodiment of the present invention.
Figure 6:
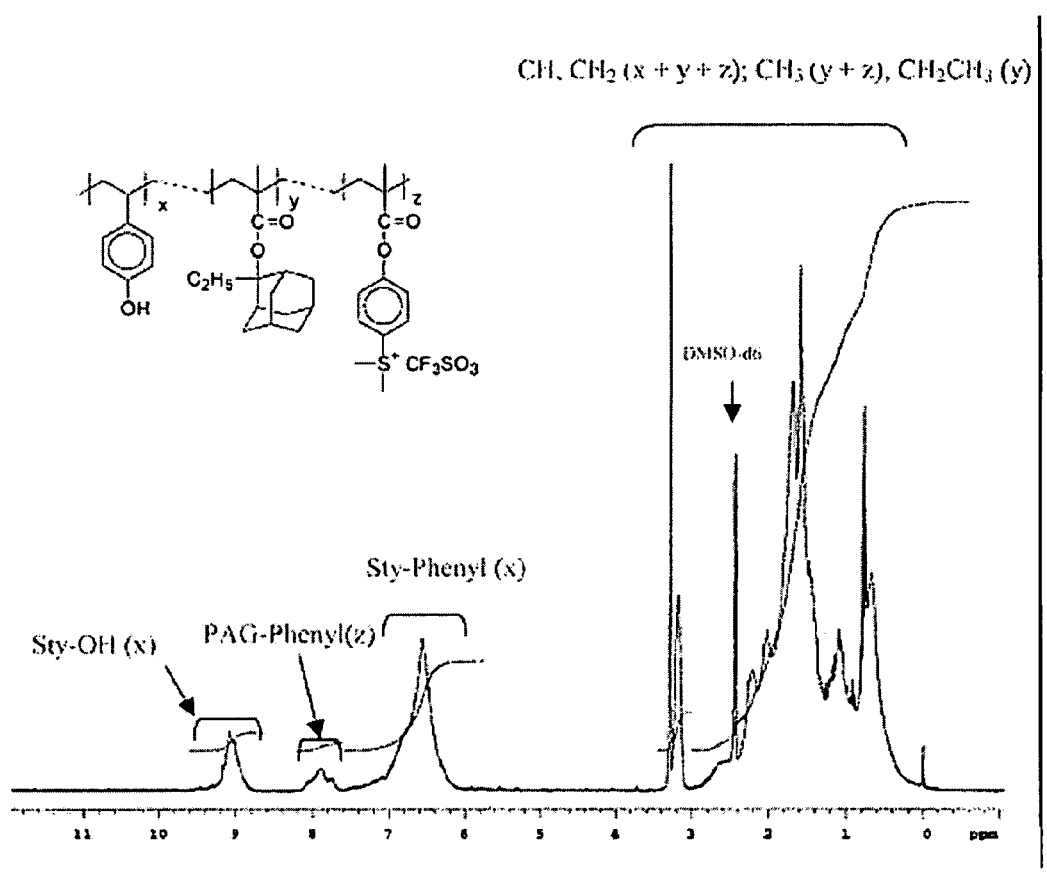
FIG. 6 illustrates a $^1$H NMR spectrum of a polymeric resist according to an embodiment of the present application.

Polymeric resists comprising a hydroxystyrene component, an adamantyl component, and a photoacid generating component can be generally synthesized according to the reaction scheme illustrated in FIG. 5. Moreover, FIG. 6 illustrates a $^1$H NMR spectrum of a polymeric resist comprising a hydroxystyrene component, an adamantyl component, and a photoacid generating component, according to one embodiment of the present invention.

In some embodiments, a polymeric resist comprising a hydroxystyrene component, an adamantyl component, and a photoacid generating component can comprise about 50 mol % hydroxystyrene component, about 45 mol % adamantyl component, and about 5% photoacid generating component.

In some embodiments, the hydroxystyrene component content of a polymeric resist comprising a hydroxystyrene component, an adamantyl component, and a photoacid generating component can range from about 40 mol % to about 50 mol %. In some embodiments the adamantyl component content of a polymeric resist comprising a hydroxystyrene component, an adamantyl component, and a photoacid generating component can range from about 40 mol % to about 60 mol %. In some embodiments the photoacid generating component content of a polymeric resist comprising a hydroxystyrene component, an adamantyl component, and a photoacid generating component can range from about 1 mol % to about 15 mol %. In some embodiments the photoacid generating component content of a polymeric resist comprising a hydroxystyrene component, an adamantyl component, and a photoacid generating component can range from about 1 mol % to about 20 mol %. In some embodiments, the photoacid generating component content can range from about 15 mol % to about 20 mol %.

In some embodiments, the weight average molecular weight ($M_w$) of a polymeric resist comprising a hydroxystyrene component, an adamantyl component, and photoacid generating component can range from about 1900 to about 3000. In some embodiments, the weight average molecular weight ($M_w$) of a polymeric resist comprising a hydroxystyrene component, an adamantyl component, and photoacid generating component can range from about 1900 to about 2500. In some embodiments, the weight average molecular weight ($M_w$) of a polymeric resist comprising a hydroxystyrene component, an adamantyl component, and photoacid generating component can range from about 2500 to about 3000. In some embodiments, the weight average molecular weight ($M_w$) of a polymeric resist comprising a hydroxystyrene component, an adamantyl component, and photoacid generating component can be greater than about 3000.

In some embodiments, the polydispersity of a polymeric resist comprising a hydroxystyrene component, an adamantyl component, and photoacid generating component can range from about 1.0 to about 2.0.

In some embodiments, a polymeric resist comprising a hydroxystyrene component, an adamantyl component, and a photoacid generating component can further comprise a base component. The base component, in some embodiments, can be blended into the polymer matrix produced by the hydroxystyrene, adamantyl, and photoacid generating components. Base components operable to blended into the polymer matrix, in some embodiments, can comprise triethyl amine, trioctyl amine, tetramethyl ammonium hydroxide, and tetrabutyl ammonium hydroxide.

In some embodiments, the base component can be incorporated in the backbone or main chain of the polymeric resist comprising the hydroxystyrene, adamantyl, and photoacid generating components. Base components operable to be incorporated into the polymeric backbone of the polymeric resist, in some embodiments, can comprise N-vinylpyrrolidone and other bases with polymerizable functionalities. Base components, according to embodiments of the present invention, can be operable to control acid diffusion and concomitantly enhance resolution.

Figure 7:
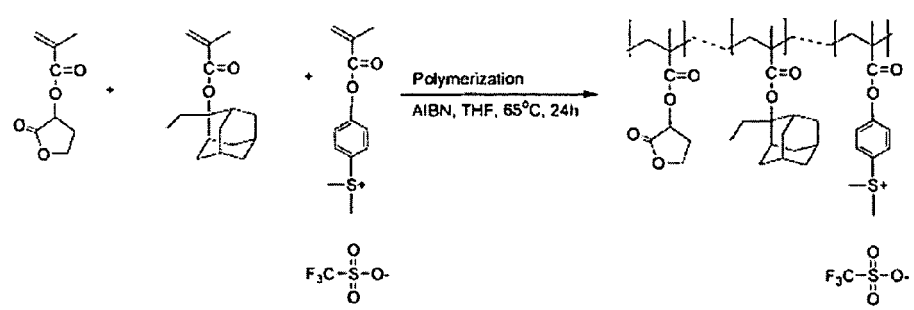
FIG. 7 illustrates a synthesis scheme for a polymeric resist according to one embodiment of the present invention.

Polymeric resists comprising an adamantyl component and a photoacid generating component, in some embodiments, may further comprise a γ-butyrolactone component. In some embodiments, the γ-butyrolactone component comprises a γ-butyrolactone methacrylate. Polymeric resists comprising a γ-butyrolactone component can be generally produced according to the synthesis scheme illustrated in FIG. 7. Polymeric resists comprising a γ-butyrolactone component can be useful of 193 nm lithographic applications.

Polymeric resists comprising an adamantyl component and a photoacid generating component, in some embodiments, may further comprise a polyhedral oligosilsesquioxane (POSS) component blended into the resist or incorporated into the polymer resist chain. POSS components suitable for incorporation into resists of the present invention are defined and illustrated in U.S. patent application Ser. No. 09/992,560. In some embodiments, a polymeric resist comprising a photoacid generating component, an adamantyl component, and a POSS component may further comprise a hydroxystyrene component, such as para-hydroxystyrene, poly-(para-hydroxystyrene) or combinations thereof.

In some embodiments, a polymeric resist can comprise a photoacid generating component and a POSS component, wherein the photoacid generating component can comprise a cationic photoacid generator, an anionic photoacid generator, a covalent photoacid generator, or combinations thereof. Cationic photoacid generators, according to some embodiments of the present invention, can comprise [p-CH$_2$=C (CH$_3$)C(O)OC$_6$H$_4$SMe$_2$]OSO$_2$CF$_3$, [p-CH$_2$=C(CH$_3$)C(O)OC$_6$H$_4$SMe$_2$]OSO$_2$C$_4$F$_9$, or combinations thereof. Anionic photoacid generators, according to some embodiments of the present invention, can comprise [p-CH$_2$=CH—C$_6$H$_4$SO$_3$]S(Me$_2$)(C$_6$H$_5$). Covalent photoacid generators, according to embodiments of the present invention, can comprise N-styrenesulfonyloxy-5-norborene-2,3 dicarboxyimide (SSNI), N-styrenesulfonyloxy phthalimide (SSPI), or combinations thereof.

Tailored Non-Chemically Amplified Resists

To address many of the inherent problems of chemically amplified resist technology, e.g. acid diffusion, post exposure instability, etc., the present invention also encompasses the design and development of resists that are directly sensitive to radiation without utilizing the concept of chemical amplification. These new resist materials, while highly sensitive to UV radiation, function as non-chemically amplified resists. This resist design is accomplished by homopolymers that are prepared from PAG components and does not require co-polymerization with chemically amplified resists.

In order for a polymer to be directly sensitive to radiation, a highly radiation sensitive group is introduced into the polymer units. Sulfonium salts have been found to be sensitive to UV radiation. For this reason, sulfonium groups can be chosen as radiation-sensitive groups in the non-chemically amplified resists described herein. It has been discovered that homopolymers prepared from polymerizable photoacid generating components are highly sensitive to UV radiation and act as non-chemically amplified resist materials.

The homo-polymerization of a PAG component, such as [p-CH$_2$=C (CH$_3$)C(O)OC$_6$H$_4$SMe$_2$]OSO$_2$CF$_3$, [p-CH$_2$=C(CH$_3$)C(O)OC$_6$H$_4$SMe$_2$]OSO$_2$C$_4$F$_9$, or combinations thereof, can be initiated by AIBN [azobis(isobutyronitrile)]. The rationale for this polymer to act as a resist was based upon solubility changes in these materials upon exposure to radiation. The unexposed photoacid generating component polymer is polar, due to its ionic character, and therefore can be soluble in polar solvents such as water. Upon exposure to 254 nm deep-UV radiation, for example, the polymers can undergo a polarity change, as evidenced by a change in solubility after irradiation. Thus, when irradiated, it is believed that the sulfur-carbon bonds in the sulfonium groups are cleaved and free acid is simultaneously generated. The irradiated polymer can thereby lose its ionic character, became less polar, and can become insoluble in polar solvents. Unexposed portions of the resist film can readily dissolve in solution such as aqueous tetramethylammonium hydroxide developer while the exposed regions are maintained after dipping the exposed resist in film developer.

Lithographic Processes

The present invention also provides lithographic processes comprising exposing a lithographic recording medium to radiation to form a pattern and developing the pattern, wherein the lithographic recording medium comprises any resist of the present invention described herein. In some embodiments, the radiation of lithographic processes of the present invention comprises extreme ultraviolet radiation, X-ray radiation, electron beam radiation, ion beam radiation, or combinations thereof. Additionally, lithographic processes of the present invention can be used to produce integrated circuits.

EXAMPLE 1

Preparation of Polymeric Resists Comprising Hydroxystyrene Component, Adamantyl Component, and Photoacid Generator Blend Synthesis of Poly(4-hydroxystyrene-co-2-(4-methoxybutyl)-2-adamantyl methacrylate)

Polymers were prepared by free radical polymerization in sealed pressure vessels. 4-Acetoxystyrene (AcOSty), 2-(4-methoxybutyl)-2-adamantyl methacrylate (MBAMA), and 2-2'-azobisisobutyronitrile (AIBN) as an initiator were dissolved in freshly dried tetrahydrofuran. Polymerization was performed at 65° C. for 24 hours, precipitated into a large amount of methanol, and dried at reduced pressure. Poly(AcOSty-co-MBAMA) was obtained as a white powder. Poly(AcOSty-co-MBAMA) with various molar feed ratios are summarized in Table 1.

Poly(4-hydroxystyrene-co-2-(4-methoxybutyl)-2-adamantyl methacrylate) [poly(HOSty-co-MBAMA)] was subsequently obtained by dispersing poly(AcOSty-co-MBAMA) copolymer in a mixture of ammonium hydroxide and methanol for six hours. After dissolution, the mixture was acidified with concentrated acetic acid and then precipitated into a large volume of distilled water. The precipitate was filtered and then dried at a reduced pressure.

Poly(AcOsty-co-MBAMA): $^1$H NMR (CDCl$_3$): δ6.2-7.2 (Phenyl), 3.2-3.4 (CH$_3$O—), 2.0-2.4 (CH$_3$COO—), 0-2.0 (Alkyl). FT-IR (NaCl): $v_{max}$ 3034 (aromatic C=C), 2921 & 2854 (Aliphatic CH), 1766 (CH$_3$COO—), 1712 (Methacrylate COO—) cm$^{-1}$.

Poly(HOSty-co-MBAMA): $^1$H NMR (DMSO-d$_6$, ppm): δ 8.8-9.3 (Phenolic-OH), 6.0-7.0 (Phenyl), 3.0-3.5 (CH$_3$O—), 0-2.5 (Alkyl). FT-IR (NaCl): $v_{max}$ 3384 (Phenolic-OH), 2920 & 2861 (Aliphatic CH), 1708 (Methacrylate COO—) cm$^{-1}$.

Synthesis of Poly(4-hydroxystyrene-co-2-methyl-2-adamantyl methacrylate)

Preparation of (4-hydroxystyrene-co-2-methyl-2-adamantyl methacrylate) proceeded as delineated above for Poly (HOSty-co-MBAMA). 2-Methyl-2-adamantyl methacrylate (MAMA) was substituted for 2-(4-methoxybutyl)-2-methacrylate.

Poly(AcOsty-co-MAMA): $^1$H NMR (CDCl$_3$): δ6.2-7.2 (Phenyl), 3.2-3.4 (CH$_3$O—), 2.0-2.4 (CH$_3$COO—), 0-2.0 (Alkyl). FT-IR (NaCl): $v_{max}$ 3034 (aromatic C=C), 2921 & 2854 (Aliphatic CH), 1766 (CH$_3$COO—), 1712 (Methacrylate COO—) cm$^{-1}$.

Poly(HOSty-co-MBAMA): $^1$H NMR (DMSO-d$_6$, ppm): δ 8.8-9.3 (Phenolic-OH), 6.0-7.0 (Phenyl), 0-2.5 (Alkyl). FT-IR (NaCl): $v_{max}$ 3384 (Phenolic-OH), 2920 & 2861 (Aliphatic CH), 1708 (Methacrylate COO—) cm$^{-1}$.

TABLE 1

| Polymer | Molar Feed Ratio (mol %) | | Copolymer Composition[a] (mol %) | | Yield (%) | $M_w$ (MWD)[b] | $T_g$[c] (°C.) |
|---|---|---|---|---|---|---|---|
| | AcOSty | MBAMA | HOSty | MBAMA | | | |
| A | 80 | 20 | 78 | 22 | 46 | 5600 (1.9) | 157 |
| B | 60 | 40 | 57 | 43 | 44 | 7200 (2.0) | 145 |
| C | 70 | 30 | 69 | 31 | 60 | 3400 (2.1) | 143 |

[a] Copolymer compositions were calculated by $^1$H NMR spectrum.
[b] $M_w$ and MWD were calculated with polystyrene standards after hydrolysis.
[c] The glass transition temperatures were measured at a heating rate of 10 C./min.
[d] 2-methyl-2-adamantyl methacrylate was used for Polymer C instead of MBAMA.

Figure 2:
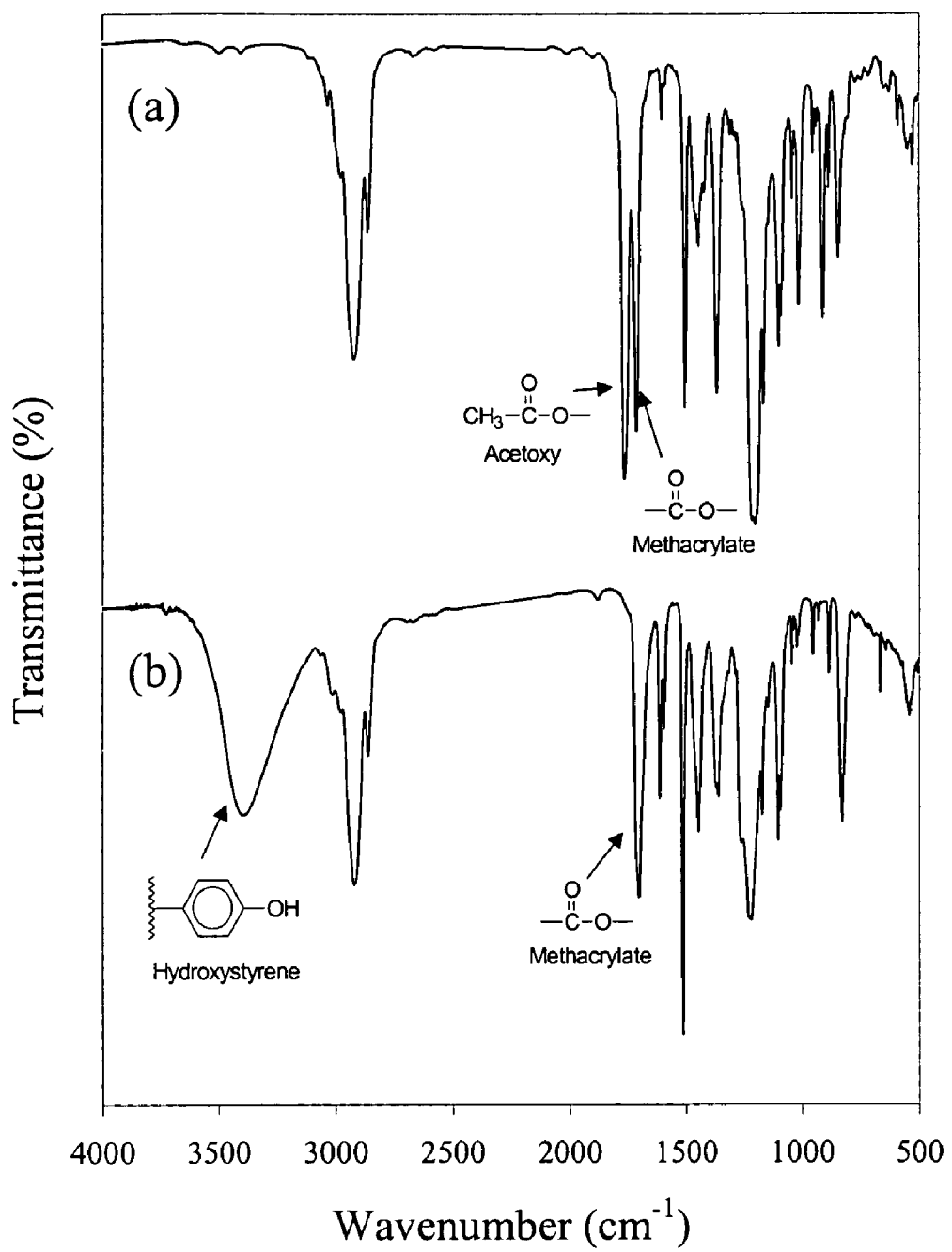
FIG. 2 illustrates an FT-IR spectrum of a polymeric resist according to an embodiment of the present invention.

The synthesis scheme of poly(4-hydroxystyrene-co-2-(4-methoxybutyl)-2-adamantly methacrylate) and poly(4-hydroxystyrene-co-2-methyl-2-adamantyl methacrylate) is illustrated in FIG. 1.

Resist solutions were prepared by dissolving 1.0 g of the polymer (A, B, or C from Table 1), 0.05 g of triphenylsulfonium nonafluoro-1-butanesulfonate (TPSNf), and 0.0025 g of tetrabutylammonium hydroxide in 10.0 g of ethyl lactate.

Lithographic Evaluation

Figure 8:
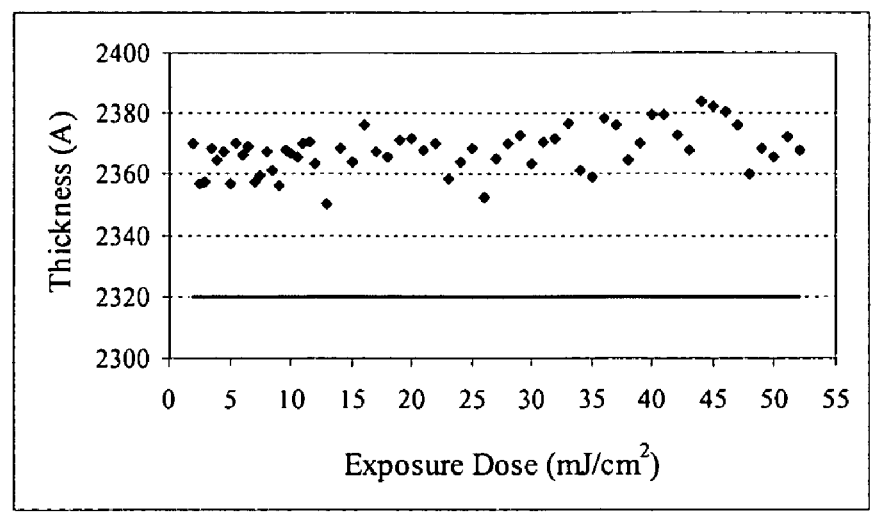
FIG. 8 illustrates the thickness of polymeric resists according to embodiments of the present invention after exposure to a radiation source.
Figure 8:
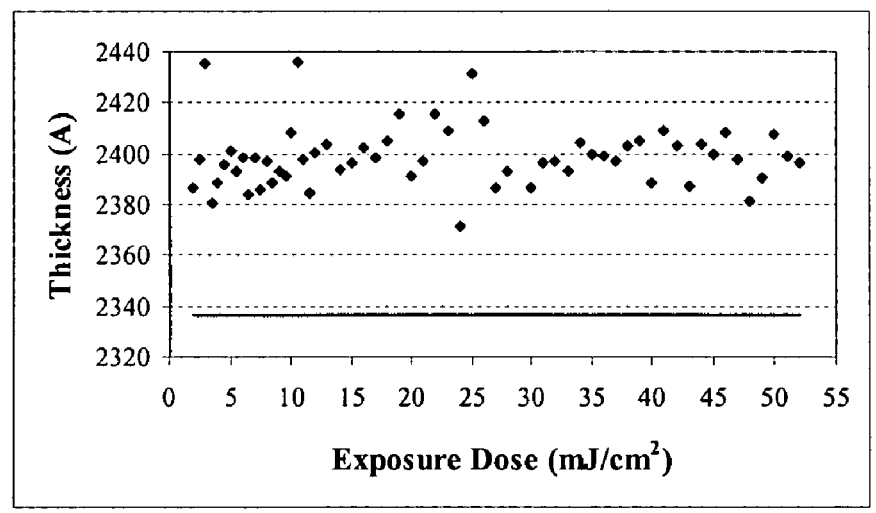

Resist solutions of polymers A, B, and C (preparation described above) were prepared and filtered before application to a silicon substrate. For KrF lithographic evaluation, DUV30 (Brewer Sci.) was used as an antireflective coating (ARC) material. Resists films were prepared by spin coating the resist solutions on ARC-coated silicon wafers and baking at 100° C. for 90 seconds. KrF exposures were administered on a KrF excimer laser scanner (Micrascan III, 0.60 NA, 0.3 sigma). The resist film thickness loss was measured by checking the resist film thickness before and after exposure without post-exposure bake with an ellipsometer. The thickness versus exposure dose was plotted for polymers A and B and is illustrated in FIG. 8 [Polymer A=8(a); Polymer B=8(b)]. The thickness results of FIG. 8 demonstrate that resists according to the present embodiment display acceptable outgassing properties.

The exposed wafers were baked again at 110° C. for 90 seconds, developed with conventional 2.38 wt. % tetramethylammonium hydroxide (TMAH) developer for 60 seconds, and rinsed with deionized water.

Figure 9:
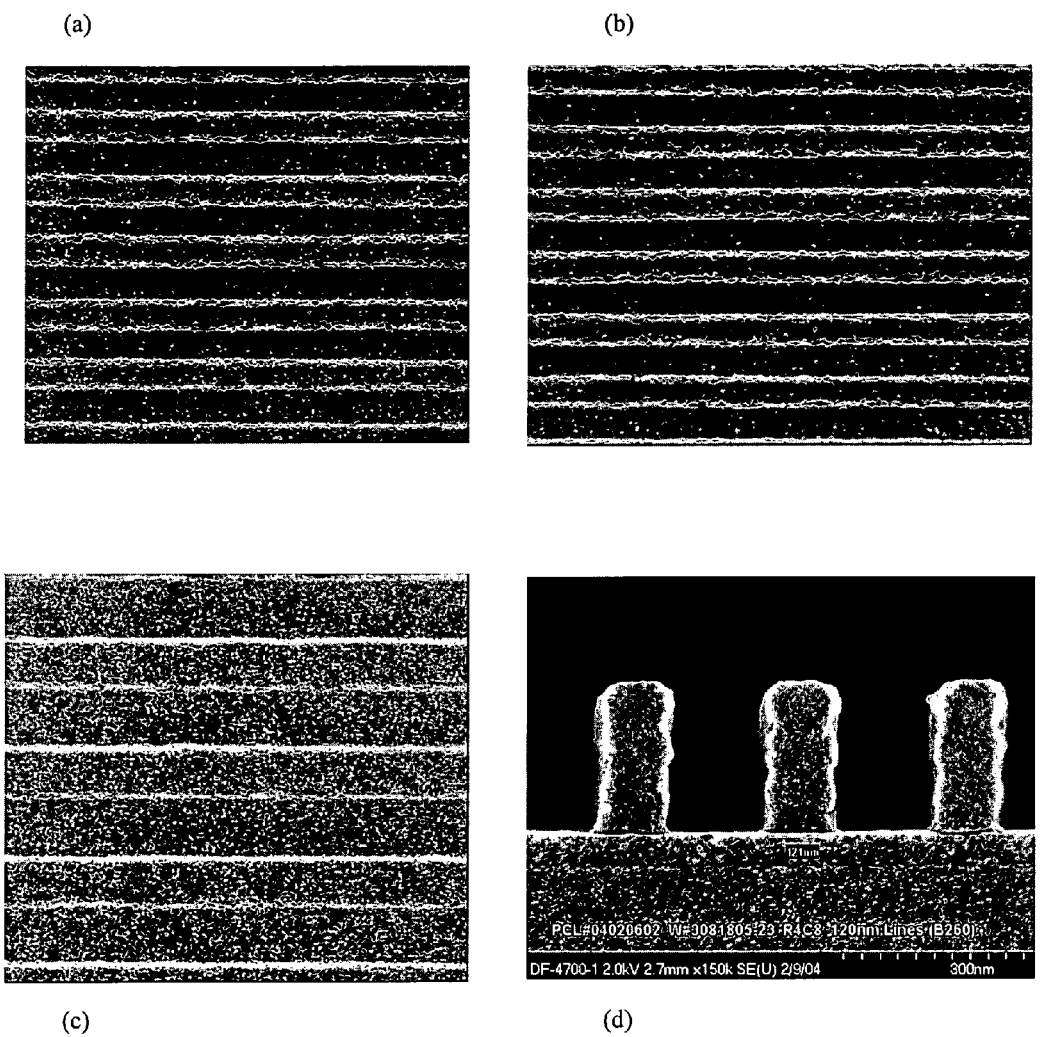
FIG. 9 illustrates scanning electron micrographs of lithographic patterns formed on polymeric resists according to embodiments of the present invention.

The resists formulated with polymers A and B displayed lower dose-to-clear and exposure dose than the resist formulated with polymer C. The scanning electron micrographs of 120 nm patterns formed with polymers A, B, and C using a KrF excimer laser scanner are illustrated in FIG. 9. The resists formulated with polymers A and B showed excellent lithographic performance. The resists formulated with polymers A and B resolved 120 nm line and space patterns (duty ratio 1:1) using a KrF excimer laser tool (0.60 NA) [FIGS. 9(a) and 9(b)]. The resist formulated with polymer C resolved 120 nm line patterns (duty ratio 1:1.6) [FIG. 9(c)]. A typical cross section of the above 120 nm line patterns is illustrated in FIG. 9(d). From these results, optimization of the polymeric resists can be achieved by producing a resist with molecular weight of about 7,000 and a MBAMA content of about 35%.

Figure 10:
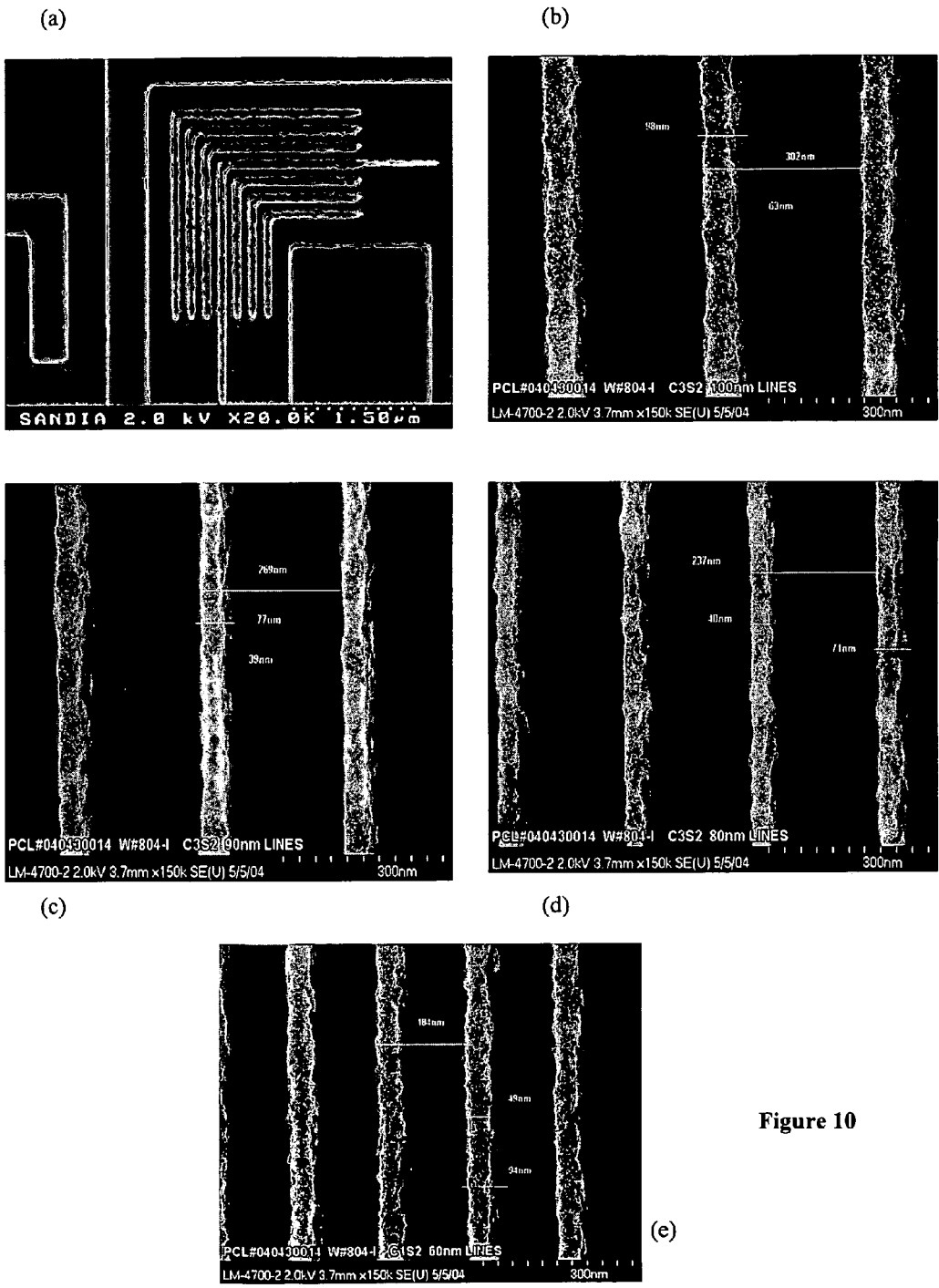
FIG. 10 illustrates scanning electron micrographs of lithographic patterns formed on a polymeric resist according to an embodiment of the present invention.

EUV lithographic evaluation was performed on polymer B. FIG. 10 illustrates scanning electron micrographs of EUV lithographic patterns formed on a resist of polymer B. The resist patterns of 100 nm elbow [FIG. 10(a)] and 100 nm (302 nm pitch), 90 nm (270 nm pitch), 80 nm (237 nm pitch), and 60 nm (180 nm pitch) lines [FIG. 10(b)-(e)] were obtained at a dose of 11.2 mJ/cm$^2$ with a conventional 2.38 wt % TMAH developer using an EUV lithography tool.

Additionally, the dry etch resistances of resists formed with polymers B and C were compared with a resist of poly(4-hydroxystyrene). The results are summarized in Table 2.

TABLE 2

| POLYMER | RELATIVE ETCH RESISTANCE |
|---|---|
| Poly(4-hydroxystyrene) | 1 |
| Polymer B | 1.06 |
| Polymer C | 1.07 |

Etching Condition: Flow rate 50 sccm, Power 100 W, and Pressure 30 m Torr

Resists comprising polymers B and C display an increased dry-etch resistance when compared with poly(4-hydroxystyrene).

EXAMPLE 2

Preparation of Polymeric Resists Comprising Photoacid Generating Component Incorporated in Polymeric Chain Synthesis of Poly(4-hydroxystyrene-co-2-ethyl-2-adamantyl methacrylate-co-4-dimethylsulfonium triflate)

Polymeric resists 1 through 4 comprising poly(4-hydroxystyrene-co-2-ethyl-2-adamantyl methacrylate-co-4-dimethylsulfonium triflate) were prepared by free radical polymerization in sealed pressure vessels. 4-Hydroxystyrene (HOST), ethyl-adamantyl methacrylate (EAMA), a vinyl photoacid generator, such as phenyl methacrylate 4-(dimethylsulfonium triflate) [p-CH$_2$=C(CH$_3$)C(O)OC$_6$H$_4$SMe$_2$]OSO$_2$CF$_3$] and 2,2'-azobisisobutyronitrile (AIBN) as an initiator were dissolved in freshly dried tetrahydrofuran (THF) and acetonitrile. Polymerization was performed at 65° C. for 24 hours and precipitated into a large amount of petroleum ether and dried at reduced pressure. Poly[HOST-co-EAMA-co-phenyl methacrylate 4-(dimethylsulfonium triflate)] was obtained as a white powder. The synthesis is illustrated in FIG. 5. Table 3 provides a summary of the synthesis results.

TABLE 3

| | Molar Feed Ratio | | | Copolymer Composition (by ¹H NMR) | | | | |
|---|---|---|---|---|---|---|---|---|
| Polymer | HOST | EAMA | PAG | HOST | EAMA | PAG | Yield (%) | $M_w$ (PDI) |
| 1 | 33.4 | 64.0 | 2.6 | 45.2 | 52.8 | 2 | 80 | 3000(2.0) |
| 2 | 31.5 | 63.2 | 5.3 | 46.0 | 49.0 | 5 | 72 | 2500(1.8) |
| 3 | 30.0 | 60.0 | 10.0 | 38 | 55.0 | 7.0 | 83 | 2800(2.0) |
| 4 | 30.0 | 57.0 | 13.0 | 42.0 | 47.5 | 10.5 | 78 | 1900(1.6) |

[a]Copolymer compositions were calculated from the ¹H NMR spectral data.
[b]$M_w$ and polydispersity index (PDI) were calculated by Gel Permeation Chromatography using polystyrene monodisperse standards.

The weight average molecular weights ($M_w$) of polymeric resists 1 through 4 were in the range of 1900 to 3000 and polydispersities around 2.0. The photoacid generating component loading in the polymeric resist ranged from 2.0% to 10.5%. The incorporation of the photoacid generating component into the resist chain was confirmed by ¹H NMR spectroscopy as illustrated in FIG. 6.

Polymeric resists comprising poly[HOST-co-EAMA-co-phenyl methacrylate 4-(dimethylsulfonium nonaflate)] were prepared in a manner consistent with the preparation of polymeric resists comprising poly[HOST-co-EAMA-co-phenyl methacrylate 4-(dimethylsulfonium triflate)].

Lithographic Evaluation

Substrates coated with poly[HOST-co-EAMA-co-phenyl methacrylate 4-(dimethylsulfonium triflate)] were prepared according to the following procedure. The casting solvent was propyleneglycol monomethyl ether (PGME). For resist formulation, 0.2 g of poly[HOST-co-EAMA-co-phenyl methacrylate 4-(dimethylsulfonium triflate)] was dissolved in 3.4 g of PGME. 0.2 wt % of tetrabutylammonium hydroxide was added to the formulation in order to control acid diffusion effects during post exposure baking (PEB). The resist solutions were filtered through a 0.2 μm filter. A film was prepared by spin coating the resist solution on a silicon wafer at 3000 rpm and baking at 100° C. for 90 sec. The film thickness was measured by ellipsometry and determined to be in the range of 120 nm-140 nm. After exposure, the wafer was baked again at 110° C. for 90 sec. Aqueous 2.38 wt % of tetramethylammonium hydroxide (TMAH) was used as a developer for 60 s and rinsed with de-ionized water. Substrate samples coated with poly[HOST-co-EAMA-co-phenyl methacrylate 4-(dimethylsulfonium triflate)] and Poly[HOST-co-EAMA-co-phenyl methacrylate 4-(dimethylsulfonium nonaflate)] were prepared.

EUV exposures were conducted at Lawrence Berkeley National Laboratory. The 0.3 NA MET based micro-exposure station is designed to deliver a diffraction limited resolution of approximately 30 nm under conventional illumination and smaller than 15 nm using dipole illumination. The synchrotron-based exposure station includes a custom coherence illuminator allowing arbitrary pupil fills with a maximum of approximately 0.83 in y and 1 in x to be generated. The coherence control being based on scanning rather than apertures in the condenser pupil plane and affords a low loss method of modifying the pupil fill.

Figure 11:
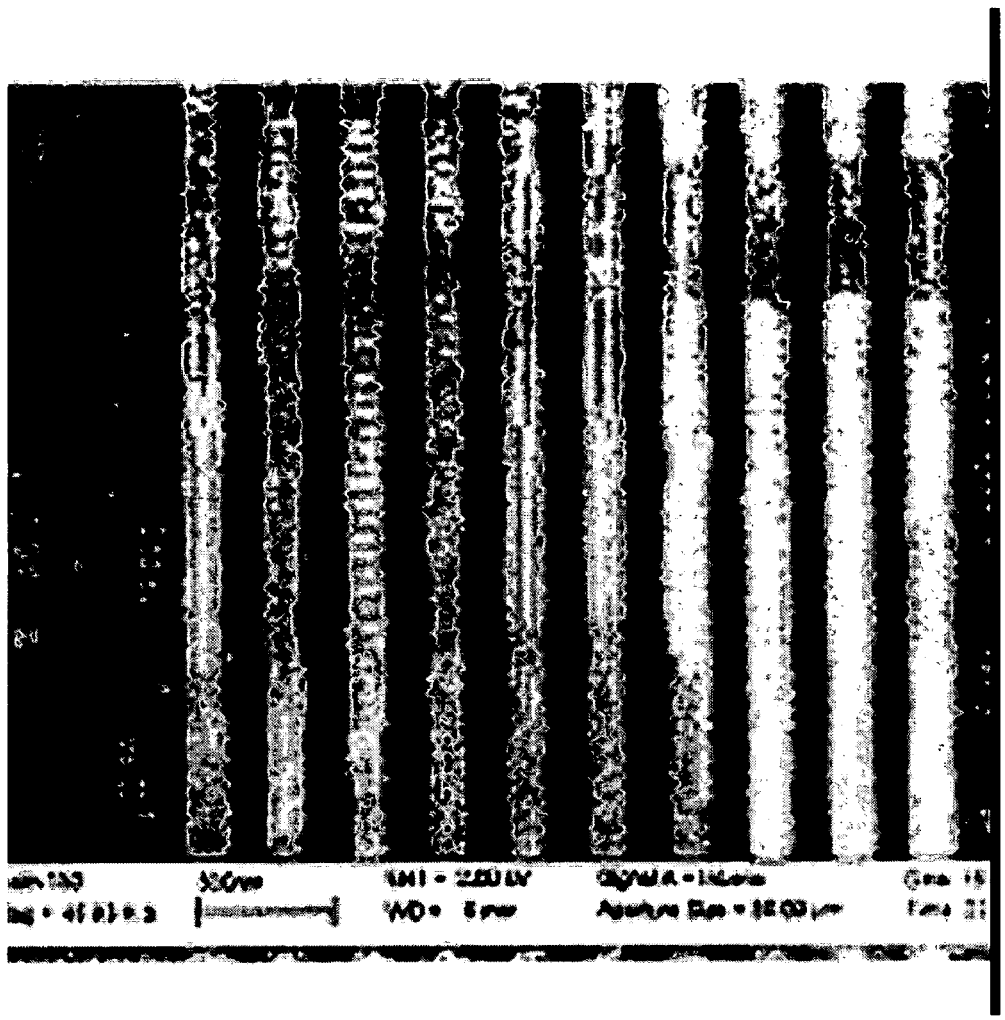
FIG. 11 illustrates a scanning electron micrograph of a lithographic pattern formed on a polymeric resist according to an embodiment of the present invention.
Figure 12:
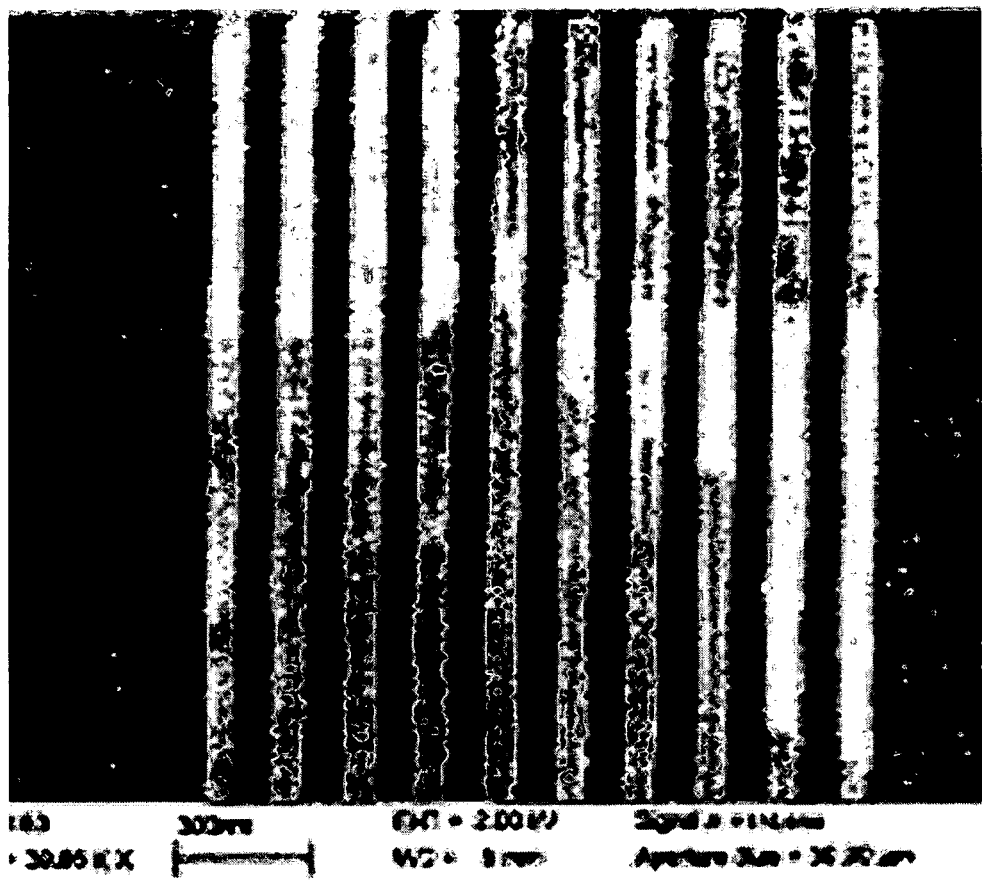
FIG. 12 illustrates a scanning electron micrograph of a lithographic pattern formed on a polymeric resist according to an embodiment of the present invention.
Figure 13:
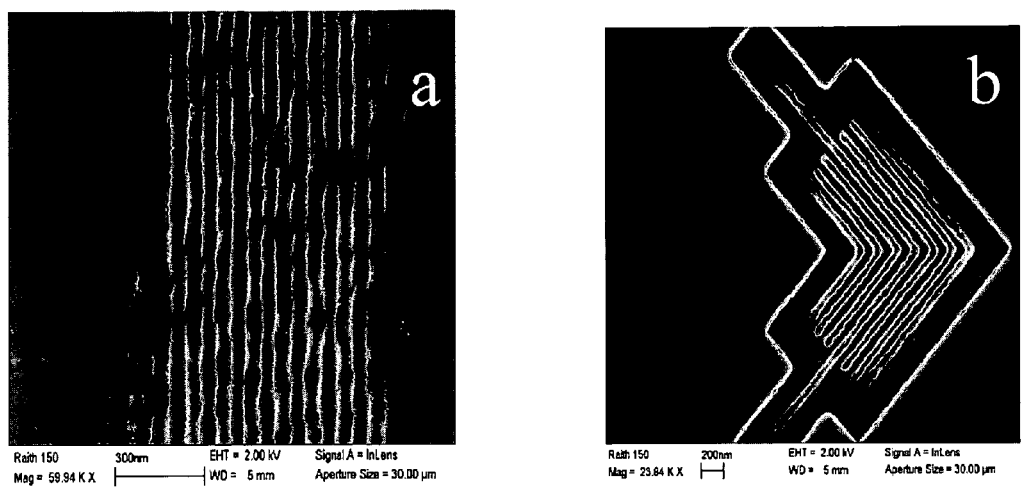
FIG. 13 illustrates scanning electron micrographs of lithographic patterns formed on a polymeric resist according to an embodiment of the present invention.

The triflate and nonaflate samples displayed 70 nm line (140 nm pitch) pattern profile as illustrated in FIGS. 11 and 12 respectively. The poly[HOST-co-EAMA-co-phenyl methacrylate 4-(dimethylsulfonium triflate)] resist demonstrated a photospeed of 8.7 mJ/cm² while the poly[HOST-co-EAMA-co-phenyl methacrylate 4-(dimethylsulfonium nonaflate)] resist demonstrated a photospeed of 6.5 mJ/cm². Moreover, the line edge roughness of the polymeric resists was determined by finding the dose to size for 70 nm 1:1 (L/S) pattern profiles and measuring the line-and-space (L/S) patterns on that field using SUMMIT software. The line edge roughness for poly[HOST-co-EAMA-co-phenyl methacrylate 4-(dimethylsulfonium triflate)] was determined to be 5.7 nm (3σ) while the line edge roughness of poly[HOST-co-EAMA-co-phenyl methacrylate 4-(dimethylsulfonium nonaflate)] was determined to be 4.6 nm (3σ). Additionally, the nonaflate resist displayed an unresolved 45 nm line (pitch 90 nm) pattern and a corresponding elbow pattern as shown in FIG. 13 [13(a) and (b)]. Replacement of EAMA with MBAMA in the polymeric chain can lead to resolution of 33 nm negative line patterns.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the present invention.

That which is claimed is:

1. A polymeric resist comprising:
an adamantyl component; and
a polymerizable cationic photoacid generator component comprising [p-CH$_2$=C(CH$_3$)C(O)OC$_6$H$_4$SMe$_2$]OSO$_2$CF$_3$, [p-CH$_2$=C(CH$_3$)C(O)OC$_6$H$_4$SMe$_2$]OSO$_2$C$_4$F$_9$, or combinations thereof.

2. A polymeric resist comprising:
an adamantyl component; and
a polymerizable anionic photoacid generator component comprising [p-CH$_2$=CH—C$_6$H$_4$SO$_3$]S(Me$_2$)(C$_6$H$_5$).

3. A lithographic process comprising:
exposing a lithographic recording medium to radiation to form a pattern and developing the pattern, the lithographic recording medium comprising a polymeric resist comprising an adamantyl component and a polymerizable cationic photoacid generator component comprising [p-CH$_2$=C(CH$_3$)C(O)OC$_6$H$_4$SMe$_2$]OSO$_2$CF$_3$, [p-CH$_2$=C(CH$_3$)C(O)OC$_6$H$_4$SMe$_2$]OSO$_2$C$_4$F$_9$, or combinations thereof.

4. A lithographic process comprising:
exposing a lithographic recording medium to radiation to form a pattern; and developing the pattern, the lithographic recording medium comprising a polymeric resist comprising an adamantyl component and a polymerizable anionic photoacid generator component comprising [p-CH$_2$=CH—C$_6$H$_4$SO$_3$]S(Me$_2$)(C$_6$H$_5$).

5. A polymeric resist comprising:
a hydroxystyrene component;
an adamantyl component; and
a polymerizable cationic photoacid generator component comprising [p-CH$_2$=C(CH$_3$)C(O)OC$_6$H$_4$SMe$_2$]

$OSO_2CF_3$, $[p\text{-}CH_2=C(CH_3)C(O)OC_6H_4SMe_2]OSO_2C_4F_9$, or combinations thereof.

6. A polymeric resist comprising:
a hydroxystyrene component;
an adamantyl component; and
a polymerizable anionic photoacid generator component comprising $[p\text{-}CH_2=CH-C_6H_4SO_3]S(Me_2)(C_6H_5)$.

7. A lithographic process comprising:
exposing a lithographic recording medium to radiation to form a pattern and developing the pattern, the lithographic recording medium comprising a polymeric resist comprising a hydroxystyrene component, an adamantyl component, and a polymerizable cationic photoacid generator component comprising $[p\text{-}CH_2=C(CH_3)C(O)OC_6H_4SMe_2]OSO_2CF_3$, $[p\text{-}CH_2=C(CH_3)C(O)OC_6H_4SMe_2]OSO_2C_4F_9$, or combinations thereof.

8. A lithographic process comprising:
exposing a lithographic recording medium to radiation to form a pattern and developing the pattern, the lithographic recording medium comprising a polymeric resist comprising a hydroxystyrene component, an adamantyl component, and a polymerizable anionic photoacid generator component comprising $[p\text{-}CH_2=CH-C_6H_4SO_3]S(Me_2)(C_6H_5)$.

9. A method for producing a polymeric resist comprising:
incorporating a photoacid generating group in a main polymeric chain of the polymeric resist, the polymeric resist comprising a base component, and the photoacid generating group comprising a cationic photoacid generator, wherein the cationic photoacid generator comprises $[p\text{-}CH_2=C(CH_3)C(O)OC_6H_4SMe_2]OSO_2CF_3$, $[p\text{-}CH_2=C(CH_3)C(O)OC_6H_4SMe_2]OSO_2C_4F_9$, or combinations thereof.

10. A method for producing a polymeric resist comprising:
incorporating a photoacid generating group in a main polymeric chain of the polymeric resist, the polymeric resist comprising a base component, and the photoacid generating group comprising an anionic photoacid generator, wherein the anionic photoacid generator comprises $[p\text{-}CH_2=CH-C_6H_4SO_3]S(Me_2)(C_6H_5)$.

11. A method for producing a polymeric resist comprising:
incorporating a photoacid generating group in a main polymeric chain of a polymeric resist wherein the photoacid generating group comprises $[p\text{-}CH_2=C(CH_3)C(O)OC_6H_4SMe_2]OSO_2CF_3$, $[p\text{-}CH_2=C(CH_3)C(O)OC_6H_4SMe_2]OSO_2C_4F_9$, or combinations thereof.

12. A method for producing a polymeric resist comprising:
incorporating a photoacid generating group in a main polymeric chain of a polymeric resist wherein the photoacid generating group comprises $[p\text{-}CH_2=CH-C_6H_4SO_3]S(Me_2)(C_6H_5)$.

* * * * *